United States Patent [19]

Shiraishi et al.

[11] Patent Number: 5,229,361
[45] Date of Patent: Jul. 20, 1993

[54] METHOD FOR FORMING JOSEPHSON JUNCTION DEVICES BY RADIATION

[75] Inventors: Kensuke Shiraishi, Gunma; Yasuo Otoguro, Tokyo; Koichi Yano, Saitama, all of Japan

[73] Assignee: Japan Atomic Energy Research Institute, Tokyo, Japan

[21] Appl. No.: 862,368

[22] Filed: Apr. 2, 1992

[30] Foreign Application Priority Data

Apr. 2, 1991 [JP] Japan .................................. 3-069761

[51] Int. Cl.$^5$ ..................... B05D 3/06; B05D 5/12; H01L 39/22
[52] U.S. Cl. ........................................ 505/1; 505/702; 505/701; 505/730; 427/62; 427/63; 427/551; 427/552; 257/31
[58] Field of Search ................... 505/1, 702, 701, 730; 427/62, 63, 35, 36, 551, 552; 357/5

[56] References Cited

U.S. PATENT DOCUMENTS

5,026,682  6/1991  Clark et al. .............................. 505/1

OTHER PUBLICATIONS

Shiraishi et al., "Gamma Irradiation Effect on the Transport Critical Current Density of a $Bi_{1.5}Pb_{0.5}Sr_2Ca_2Cu_3O_x$ Ceramic," Jpn. J. Appl. Phys. vol. 31 (3A) Mar. 1992 L227-230.

Shiraishi et al., "Ion Irradiation Effect on $Ba_2YCu_3O_7$ Superconductor," Jpn. J. Appl. Phys. 28(3) Mar. 1989 pp. L409-L411.

Kato et al, "Radiation Effect of $YBa_2Cu_3O_{7-y}$ Irradiated by X-Rays and 14 Mev Neutrons", Jpn. J. Appl. Phys. 27(11) Nov. 1988 pp. L2097-2099.

D. K. Chin et al., *Novel All-High $T_c$ Epitaxial Josephson Junction*, Appl. Phys. Lett. 58 (7), Feb. 18, 1991, p. 753.

J. Gao et al., *Controlled Preparation of All High-$T_c$ SNS-Type Edge Junctions and DC SQUIDS*, Physica C 171 (1990) (Elsevier Science Publishers B. V., North-Holland), p. 126.

C. T. Rogers et al., *Fabrication of Heteroepitaxial $YBa_2Cu_3O_{7-x}$-$PrBa_2Cu_3O_{7-x}$-$YBa_2Cu_3O_{7-x}$, Josephson Devices Grown by Laser Deposition*, Appl. Phys. Lett. 55 (19), Nov. 6, 1989, p. 2032.

R. H. Koch et al., *Quantum Interference Devices made from Superconducting Oxide Thin Films*, Appl. Phys. Lett. 51 (3), Jul. 20, 1987, p. 200.

A. E. White et al., *Controllable Reduction of Critical Currents in $YBa_2Cu_3O_{7-c}$ Films*, Appl. Phys. Lett. 53 (11), Sep. 12, 1988, p. 1010.

M. E. Gross et al., *Superconducting Thin Films and Ion Beam Patterning Using Metal Carboxylate Precursors*, Solid States Ionics 32/33 (1989) (Elsevier Science Publishers B. V., North-Holland), p. 1051.

S. Matsui et al., *Focused Ion Beam Processes for High-$T_c$ Superconductors*, J. Vac. Sci. Technol. B6 (3), May/Jun. 1988, p. 900.

S. Matsui et al., *Ion and Electron Beam Irradiation Effects for High-$T_c$ Superconductors*, J. Appl. Phys. 58 (8) (1989) (Japan), p. 76, including 1-sentence English-language summary.

G. J. Clark et al., *Radiation Effects in Thin Films of High $T_c$ Superconductors*, Nuclear Instruments & Methods in Phys. Research B32 (1988), p. 405.

G. J. Clark et al., *Ion Beam Amorphization of $YBa_2Cu_3O_x$*, Appl. Phys. Lett. 51 (18), Nov. 2, 1987, p. 1462.

G. J. Clark et al., *Effects of Radiation Damage in Ion-Implanted Thin Films of Metal-Oxide Superconductors*, Appl. Phys. Lett. 51 (2), Jul. 13, 1987, p. 139.

*Primary Examiner*—Roy King
*Attorney, Agent, or Firm*—Banner, Birch, McKie & Beckett

[57] ABSTRACT

A method for forming an insulating layer in an oxide high-temperature superconductor is described. The oxide high-temperature superconductor is exposed to radiation, whereby an interface showing superconducting characteristics and/or a weak link that is present at an interface in the said oxide high-temperature superconductor is transformed to a thin insulating layer.

13 Claims, No Drawings

METHOD FOR FORMING JOSEPHSON JUNCTION DEVICES BY RADIATION

FIELD OF THE INVENTION

This invention relates to a method for forming an insulating layer in oxide high-temperature superconductors by irradiation. The insulating layer is suitable for the manufacturing electronic devices such as Josephson junctions that are composed of oxide high-temperature superconductors.

BACKGROUND OF THE INVENTION

Conventional metal or compound superconductors that are used as Josephson devices of a tunnel junction include those which have niobium pentoxide ($Nb_2O_5$), silicon (Si) or aluminum oxide ($Al_2O_3$) connected as an insulating layer between two niobium (Nb) layers, as well as those which have amorphous silicon or magnesium oxide (MgO) connected as an insulating layer between two niobium nitride (NbN) layers.

Since the oxide high-temperature superconductor has a short coherence length, the fabrication of tunnel junction type Josephson devices requires providing a thin (<100 nm) and uniform insulating layer. Such insulating layers can be prepared fairly easily by oxidizing the surface of metals, thus currently fabricated Josephson devices of the tunnel junction type have and insulating metal oxide layer sandwiched between an oxide high-temperature superconductor and a metal superconductor.

Tunnel junction type Josephson devices having an insulating layer sandwiched between oxide high-temperature superconductors are also available and one example is a device that has a barrier $PrBa_2Cu_3O_x$ sandwiched between two $YBa_2Cu_3O_x$ layers. In this device, $PrBa_2Cu_3O_x$ forming the barrier layer is in a rhombic system that is a different crystal system than the superconducting phase and, hence, nonuniformity of the critical current density along the barrier layer may result. To solve this problem, a Josephson device has been fabricated in which niobium (Nb) doped $SrTiO_3$ is sandwiched between YBaCuO superconductors.

The Josephson devices described above that use oxide high-temperature superconductors are fabricated by epitaxial growth, so the combinations of materials from which the devices can be manufactured are very limited from the viewpoint of matching between the superconductor and the barrier layer in terms of electrical and crystallographic characteristics.

It is known that an irradiated part of an oxide high-temperature superconductor will turn into an insulator. S. Matsui et al. reported in J. Vac. Sci. Technol., B6 (3), 900 (1988) that an electronic circuit could be fabricated by applying a focused ion beam spot onto an oxide high-temperature superconductor so that the illuminated area would become an insulator in a width of no more than 1 μm. However, as noted hereinabove, the thickness of the insulating layer must be controlled to less than 100 nm in order to fabricate a Josephson device of the tunnel junction type. In other words, it is very difficult to fabricate the desired tunnel junction type Josephson device by the FIB (focused ion beam) method.

On the other hand, it is possible to fabricate a Josephson device of a bridge type by the FIB method. As a matter of fact, A. E. White et al. reported in Appl. Phys. Lett., 53 (11), 1010 (1988) that the Josephson effect was observed in a bridge type sample prepared by the FIB method. However, no one has ever reported the case of successful fabrication of a tunnel junction type Josephson device by irradiation of an oxide high-temperature superconductor.

SUMMARY OF THE INVENTION

An object, therefore, of the present invention is to provide a method by which a thin insulating layer can be formed in any kind of oxide high-temperature superconductors to fabricate Josephson junctions and other devices to be used in electronics.

Another object of the present invention is to provide a process for fabricating an electronic device such as a Josephson junction that uses an oxide high-temperature superconductor as a component.

The present inventor conducted intensive studies in order to solve the aforementioned problems of the prior art and, as a result, found that radiation effects on interfaces such as grain boundaries and stacking faults in the oxide high-temperature superconductor would be different from those on the superconducting phase in other areas and that such interfaces were microprocessable by irradiation. The present invention has been accomplished on the basis of these findings.

DETAILED DESCRIPTION OF THE PREFERRED EMBODIMENT

In accordance with one aspect of the present invention, there is provided a method in which an oxide high-temperature superconductor is exposed to radiation, whereby an interface showing superconducting characteristics and/or a weak link layer that is present along an interface in the said oxide high-temperature superconductor is transformed to a thin insulating layer.

In accordance with another aspect of the present invention, there is provided a process for producing a device such as a Josephson junction that is to be used in electronics, said process comprising the steps of:

a) joining together two layers of similar or dissimilar oxide high-temperature superconductors; and b) exposing the assembly to a radiation so that the plane of junction is transformed to a thin insulating layer.

This process is applicable to any kind of oxide high-temperature superconductors.

The "insulating layer" as used herein means a layer that will no longer exhibit superconductivity by itself since the regularity of the crystalline structure of the superconductor at issue has been disordered. The term "thin" as used herein means a sufficient thickness for a tunnel current to flow by the Josephson effect. The term "interface" as used herein means an area of the oxide superconductor at issue that has a planar extent as exemplified by a plane of junction with another material, the grain boundary, the twin boundary, the stacking fault or modulated structural boundaries and that atomic arrangement in the matrix of the superconductor would be disordered at the interface. The "interface" includes both the planar extent that exhibits superconducting characteristics and a "weakly linked layer".

Oxide high-temperature superconductors usually involve interfaces as defined above, which are generally referred to as "planar defects". Macroscopically, interfaces can be regarded to have the same morphology but, microscopically, they do not show a completely identical morphology. In other words, an interface exhibits essentially superconducting characteristics, another is that the superconducting crystals are weakly linked at the interface and that is generally referred to as a "weak link". Although the weak link exhibits superconducting characteristics under a certain condition, the weak link is readily decoupled by high current flow. In the present invention, an oxide high-temperature superconductor is irradiated, whereby an interface showing superconducting characteristics that is present in the superconductor and/or a weak link that is also present at an interface in said superconductor is transformed to a thin insulating layer.

The principle behind this transformation is the observation that the interface is different in atomic arrangement from the perfect crystal. Hence, by exposing an oxide high-temperature superconductor to radiation that is insufficient to damage the crystal structure in areas other than the vicinity of an interface in the superconductor. microprocessing can be accomplished in such a way that only the interface is selectively transformed to a thin insulating layer. In a preferred embodiment of the present invention, the insulating layer has a thickness less than 100 nm. The thickness of the insulating layer can be varied by properly adjusting the exposure dose and/or dose rate of the radiation to be applied. If the thickness of the insulating layer is further increased by the irradiation, the interface will eventually become a literal "electric insulator".

The formation of an insulating layer at an interface in the oxide high-temperature superconductor of interest can be checked by measuring an electrical characteristics of that superconductor. Stated more specifically, one may safely conclude that an interfacial insulating layer has formed when the transport critical current density measured after irradiation is lower than the initial value measured before the irradiation. This decrease in the transport critical current density by irradiation corresponds to a decrease in the superconducting transition temperature measured with high current density on account of irradiation.

The mechanism behind the phenomenon in which an interface that exhibits superconducting characteristics and/or a weak link in an oxide high-temperature superconductor is transformed to an insulating layer upon irradiation has not been fully understood. In exposure to particle radiations such as heavy ions, electron beams and neutrons, atoms in the crystal lattice sites would be "knocked out" from their lattice position to cause an atomic disordering, eventually leading to the formation of an insulating layer at the interface. On the other hand, in exposure to light (electromagnetic waves) such as $\gamma$-rays, X-rays and ultraviolet rays, the position of oxygen atoms would be changed by exciting lattice vibrations, thus forming an interfacial insulating layer.

The dose rate of an exposed radiation is a critical factor in insuring that only an interface in the oxide high-temperature superconductor is transformed to an insulating layer having a suitable thickness. Stated more specifically, with a given exposure dose, a short irradiation will suffice if the dose rate is high but, although difficulty is sometimes involved in controlling the thickness of the insulating layer being formed. If the dose rate is low, it is easy to control the thickness of the insulating layer but, on the other hand, it takes an unduly long time to complete the irradiation. It should also be noted here that if the dose rate is low, it is comparatively easy to form an insulating layer only at an interface in the superconductor without causing any change in areas other than the interface.

In a preferred embodiment of the present invention, $(Bi,Pb)Sr_2Ca_2Cu_3O_{10}$ is irradiated with $^{60}Co$ $\gamma$-rays and, in this case, satisfactory results are obtained with the dose rate being in the range of ca. 1–5 Mrad/h. If the radiation is an electron beam of 3 MeV, the dose rate may be in the range of ca. $1-100\times10^{16}$ m$^{-2}$s$^{-1}$; if the radiation is He$^+$ of 200 keV, the dose rate may be in the range of $1-10\times10^{13}$ m$^{-2}$s$^{-1}$; and if the radiation is N$^+$ of 200 keV, the dose rate may be in the range of ca. $1\times10^{12}$ m$^{-2}$s$^{-1}$.

In another preferred embodiment of the present invention, $YBa_2Cu_3O_7$ is irradiated with $^{60}Co$ $\gamma$-rays and, in this case, satisfactory results are obtained with the dose rate being in the range of ca. 1–10 Mrad/h. If the radiation is an electron beam of 3 MeV, the dose rate may be in the range of ca. $1-100\times10^{17}$ m$^{-2}$s$^{-1}$; if the radiation is He$^+$ of 200 keV, the dose rate may be in the range $1-10\times10^{14}$ m$^{-2}$s$^{-1}$; and if the radiation is N$^+$ of 200 keV, the dose rate may be in the range of ca. $1-10\times10^{12}$ m$^{-2}$s$^{-1}$.

When oxide high-temperature superconductors are irradiated, the thickness of the insulating layer being formed will usually increase with the exposure dose. As already mentioned hereinabove, the primary purpose of the present invention is to form an insulating layer at an interface in an oxide high-temperature superconductor that is thin enough to permit the flow of a tunnel current under the Josephson effect. A desired thin insulating layer cannot be obtained if excessive radiations are applied. Guide figures for the exposure dose of radiations that is appropriate for attaining the objects of the present invention are as follows. In the case of irradiating $(Bi,Pb)_2Sr_2Ca_2Cu_3O_{10}$ with $^{60}Co$ $\gamma$-rays, the total dose is preferably in the range of ca. 1–25 Mrad; if the radiation is an electron beam of 3 MeV, the total dose is preferably in the range of ca. $1-100\times10^{19}$ m$^{-2}$; if the radiation is He$^+$, the total dose is preferably in the range of $1-10\times10^{13}$ m$^{-2}$; and if the radiation is N$^+$ of 200 keV, the total dose is preferably in the range of ca. $1-10\times10^{11}$ m$^{-2}$. In the case of irradiating $YBa_2Cu_3O_7$ with $^{60}Co$ $\gamma$-rays, the total dose is preferably in the range of ca. 1–100 Mrad; if the radiation is an electron beam of 3 MeV, the total dose is preferably in the range of ca. $2-5\times10^{22}$ m$^{-2}$; if the radiation is He$^+$ of 200 keV, the total dose is preferably in the range of $1-50\times10^{15}$ m$^{-2}$; and if the radiation is N$^+$ of 200 keV, the total dose is preferably in the range of ca. $1-50\times10^{13}$ m$^{-2}$.

The oxide high-temperature superconductor that can be used in the present invention include Y-system which contain yttrium as an essential constituent element, Bi-system which contain bismuth as an essential constituent element, Tl-system which contain thallium as an essential constituent element, and any other compounds that have those chemical compositions which exhibit superconductivity.

The superconductor to be used in the present invention may be prepared by sintering, melting, deposition on substrates and any other methods. These superconductors may be of any shape or form, as exemplified by a polycrystalline form, a single-crystal form, a thin film or a thick film. In short, the oxide high-temperature superconductors to be used in the present invention are not limited in any way as regards the production process, shape or form.

The radiations to be used in the present invention include, but are not limited to, electromagnetic waves such as γ-rays, X-rays and laser light, and particle radiations such as electrons, positrons, α-particles and heavy ions. Such radiations may be generated by any methods including, for example, the use of a radiation generator, an accelerator or a nuclear reactor, and radioactive decay.

As described above, the radiations to be applied in the present invention are not limited to any particular type. However, particularly good results were obtained when γ-rays, electron beams or heavy ions were used.

In the most preferred embodiment of the present invention, a sintered $(Bi,Pb)_2Sr_2Ca_2Cu_3O_{10}$ superconductor is irradiated with $^{60}Co$ γ-rays for a total dose of ca. 1-25 Mrad at a dose rate of ca. 1-5 Mrad/hr, thereby forming a thin insulating layer.

In accordance with the other aspect of the present invention, there is provided a process for fabricating an electronic device such as a Josephson junction that uses an oxide high-temperature superconductor as a component.

According to this process, two layers of similar or dissimilar oxide high-temperature superconductors are joined together. The two layers can be joined together by heat treating the two superposed single crystals of oxide high-temperature superconductor at an appropriate temperature. However, this is not the sole case of the present invention and an interface may be sandwiched between two evaporated layers of a superconductor; this method has conventionally been adopted in the fabrication of Josephson junctions. The plane of junction of the two superconductive layers provides an interface of the type described above and a thin insulating layer is formed at this interface by applying a radiation to the assembly. As a result, a Josephson junction is produced as an assembly of two layers of oxide high-temperature superconductor having a thin insulating layer sandwiched therebetween. In a particularly preferred embodiment of the present invention, two layers of a sintered $(Bi,Pb)_2Sr_2Ca_2Cu_3O_{10}$ are joined together and $^{60}Co$ γ-rays are applied to the resulting interface for a total dose of ca. 1-25 Mrad at a dose rate of ca. 1-10 Mrad/hr, thereby forming a thin insulating layer at that interface.

The present inventors made a close study on the radiation effects to the superconducting transition temperature. As a result, they found that in the early period of exposure (i.e., with low-dose exposure), the superconducting transition temperature measured with high current density became higher than before the exposure. The transition temperature decreased upon further exposure to the radiation. This phenomenon was noticeable when exposure was made to particle radiations such as electron beams or heavy ions. As the result of further studies, it became clear that the phenomenon under consideration occurred because in the early period of exposure to radiation, the weak link present at an interface in an oxide high-temperature superconductor was transformed, partly to be superconducting phase. Upon further exposure to the radiation, the interface would be transformed to the insulating layer described above. Therefore, if utmost care is taken to prepare an ideal oxide superconductor which does not involve a weak link, the above-described increase in the transition temperature will not be observed in the early period of exposure to a radiation.

The oxide high-temperature superconductor having the weak link and the high quality superconductor having no such weak link will behave differently in the early period of exposure to radiation but the technical rationale of the present invention will not be lost by this fact. In other words, a thin insulating layer will eventually be formed at an interface in oxide high-temperature superconductors regardless of their type if they are subjected to sufficient exposure to radiation.

As described on the foregoing pages, the method of the present invention which is characterized by forming an insulating layer in the oxide high-temperature superconductor through exposure to a radiation is applicable to any type of oxide high-temperature superconductors. Hence, the present invention will open a wide door to the electronics application of oxide high-temperature superconductors as exemplified by the fabrication of Josephson junctions which will work at the temperature of liquid nitrogen.

The following examples are provided for the purpose of further illustrating the present invention but are in no way to be taken as limiting.

EXAMPLE 1

A sintered $Bi_{1.5}Pb_{0.5}Sr_2Ca_2Cu_3O_{10}$ pellet measuring ca. 10 mm×1.5 mm×0.5 mm was prepared and exposed to $^{60}Co$ γ-rays at a dose rate of 1.5 Mrad/hr. After exposure to γ-rays, the electric resistance of the pellet was measured with high current density to investigate the radiation effects on the transition temperature. The current density was 115 kA/m$^2$. The transition temperature of 97.5K before exposure to γ-rays was decreased to 97.0K upon exposure of γ-rays to a total dose of 2 Mrad. Upon further exposure of γ-rays to a total dose of 7.5 Mrad, the transition temperature further decreased to 92.1K. This verified the formation of a thin insulating layer along the interface in the pellet.

A pellet was prepared in the same manner as described above and the transport critical current density was measured over the temperature range from 20K to 90K. As a result, the transport critical current density was found to decrease at temperatures below 65K after exposure of γ-rays to a dose of 2 Mrad. Upon further exposure of γ-rays up to a total dose of 24 Mrad. Upon further exposure of γ-rays up to a total dose of 24 Mrad, the transport critical current density in the low temperature regime decreased with an increase in the dose and, at the same time, the upper limit of temperatures where the radiation effect was observed became higher with the increase in exposure of γ-rays. This was another evidence that verified the formation of a thin insulating layer at the interface in the pellet by the exposure to γ-rays.

EXAMPLE 2

A sintered $(Bi,Pb)_2Sr_2Ca_2Cu_3O_{10}$ pellet measuring ca. 10 mm×1.5 mm×0.5 mm was prepared and exposed to electron beams of 3 MeV for a total dose of $0.5-50\times10^{19}$ m$^{-2}$. The dose rate of electron beams was $0.8-30\times10^{15}$ m$^{-2}$s$^{-1}$. After exposure to electron beams, the electric resistance of the pellet was measured with high current density to determine the superconducting transition. The current density was 85.5 kA/m$^2$. The transition temperature of 103.1K before exposure to electron beams increased to 105.3K upon exposure of electron beams to a total exposure of $1.0\times10^{19}$ m$^{-2}$. Upon further exposure of electron beams to a dose of $4.0\times10^{19}$ m$^{-2}$, the transition temperature decreased to 100K. This verified the formation of a thin insulating layer at the interface in the crystal of the pellet.

EXAMPLE 3

A sintered $YBa_2Cu_3O_7$ pellet measuring ca. 10 mm×1.5 mm×0.5 mm was prepared and exposed to electron beams of 3 MeV for a total dose of $0.5-3\times10^{22}$ $m^{-2}$. The dose rate of electron beams was $4.4\times10^{17}$ $m^{-2}s^{-1}$. After exposure to electron beams, the electric resistance of the pellet was measured with high current density to determine the superconducting transition temperature. The current density was 100 kA/m². The transition temperature of 88.6K before exposure to electron beams increased to 90.4K upon exposure of electron beams to a total exposure of $1.5\times10^{22}$ $m^{-2}$. Upon further exposure of electron beams to a total dose of $3\times10^{22}$ $m^{-2}$, the critical temperature decreased to 89K. This verified the formation of a thin insulating layer at the interface in the pellet.

EXAMPLE 4

A sintered $YBa_2Cu_3O_7$ pellet measuring ca. 10 mm×1.5 mm×0.5 mm was prepared and exposed to nitrogen ions ($N^+$) of 200 keV. The nitrogen ions had been accelerated with an ion accelerator. The dose rate of nitrogen ions was $0.3-6.0\times10^{13}$ $m^{-2}s^{-1}$. Before and after the exposure to nitrogen ions, the electric resistance of the pellet was measured with high current density to determine the superconducting transition temperature. The current density was 100 kA/m². The transition temperature of 87.9K before exposure to nitrogen ions increased to 90.9K upon exposure to nitrogen ions for a total exposure of $8.4\times10^{-3}$ $m^{-2}$. Upon further exposure of nitrogen ions to a total dose of $1\times10^{15}$ $m^{-2}$, the critical temperature decreased to 89K. This verified the formation of a thin insulating layer at the interface in the pellet.

The insulating layers formed in Examples 1-4 by irradiation were stable to heat cycles between room temperature and 20K, as well as under prolonged standing at room temperature.

What is claimed is:

1. A method of treating an oxide high-temperature superconductor having a planar defect in its crystalline structure, said method comprising exposing said superconductor to radiation sufficient to transform the portion of said superconductor at said planar defect into an insulating layer such that said insulating layer permits the flow of a tunnel current, wherein said radiation is γ-rays or an electron beam.

2. The method according to claim 1, wherein said insulating layer has a thickness of about 100 nm or less.

3. The method according to claim 1, wherein said superconductor is $(Bi,Pb)_2Sr_2Ca_2Cu_3O_{10}$.

4. The method according to claim 3, wherein said superconductor is exposed to $^{60}Co$ γ-rays at a dose of about 1-25 Mrad.

5. The method according to claim 3, wherein said superconductor is exposed to an electron beam of 3 MeV at a dose of about $1-100\times10^{19}$ $m^{-2}$.

6. The method according to claim 1, wherein said superconductor is $YBa_2Cu_3O_7$.

7. The method according to claim 6, wherein said superconductor is exposed to $^{60}Co$ γ-rays at a dose of about 1-100 Mrad.

8. The method according to claim 6, wherein said superconductor is exposed to an electron beam of 3 MeV at a dose of about $2-5\times10^{22}$ $m^{-2}$.

9. A method of forming a Josephson Junction device comprising the steps of:
   joining two layers of oxide high-temperature superconductor to form a structure having an interface defined by the junction of said two layers; and
   exposing said structure to radiation such that the portion of said structure at said interface is transformed into an insulating layer wherein said insulating layer permits the flow of a tunnel current.

10. The method according to claim 9, wherein said structure is exposed to γ-rays or an electron beam.

11. The method according to claim 9, wherein said two layers are superposed and joined by heat treating.

12. The method according to claim 11, wherein said two layers are $(Bi,Pb)_2Sr_2Ca_2Cu_3O_{10}$, and said structure is exposed to $^{60}Co$ γ-rays at a dose of about 1-25 Mrad.

13. The method according to claim 11, wherein said two layers are $YBa_2Cu_3O_7$, and said structure is exposed to $^{60}Co$ γ-rays at a dose of about 1-100 Mrad.

* * * * *